United States Patent
Kuan et al.

(10) Patent No.: US 8,665,921 B2
(45) Date of Patent: Mar. 4, 2014

(54) METHOD AND APPARATUS OF AUTOMATIC POWER CONTROL FOR BURST MODE LASER TRANSMITTER

(75) Inventors: Chi-Kung Kuan, Daxi Township, Taoyuan County (TW); Gerchih Chou, San Jose, CA (US); Chia-Liang Lin, Fremont, CA (US)

(73) Assignee: Realtek Semiconductor Corp., Hsinchu (TW)

( * ) Notice: Subject to any disclaimer, the term of this patent is extended or adjusted under 35 U.S.C. 154(b) by 274 days.

(21) Appl. No.: 13/347,875

(22) Filed: Jan. 11, 2012

(65) Prior Publication Data

US 2013/0177325 A1    Jul. 11, 2013

(51) Int. Cl.
*H01S 3/00* (2006.01)
(52) U.S. Cl.
USPC ............. 372/38.02; 372/38.07; 372/38.1; 372/29.011; 372/29.015
(58) Field of Classification Search
CPC ............. H01S 5/06835; H01S 5/0683; H01S 5/06808; H01S 5/06812; H01S 5/06817

USPC ......... 372/38.02, 38.07, 38.1, 29.011, 29.015
See application file for complete search history.

(56) References Cited

U.S. PATENT DOCUMENTS

2007/0280086 A1* 12/2007 Yu et al. ........................ 369/116
2008/0025733 A1* 1/2008 Nazarathy et al. ............ 398/209

* cited by examiner

*Primary Examiner* — Kinam Park
(74) *Attorney, Agent, or Firm* — McClure, Qualey & Rodack, LLP (57) ABSTRACT

An apparatus of automatic power control for burst mode laser transmitter and method are provided. In one implementation a method includes: generating an output current with a modulation pattern determined by a transmit data and a transmit enable signal, and a modulation level determined by a first control code and a second control code, wherein a light signal is generated in response to the output current; generating a first decision based on a comparison between a photodiode current and the first reference current, a second decision based on a comparison between the photodiode current and the second reference current, wherein the photodiode current is generated in accordance to the light signal; and generating the first control code and the second control code in response to the first decision and the second decision.

17 Claims, 8 Drawing Sheets

METHOD AND APPARATUS OF AUTOMATIC POWER CONTROL FOR BURST MODE LASER TRANSMITTER

FIELD OF TECHNOLOGY

This disclosure relates generally to method and apparatus of burst mode transmitter.

BACKGROUND

Figure 1:
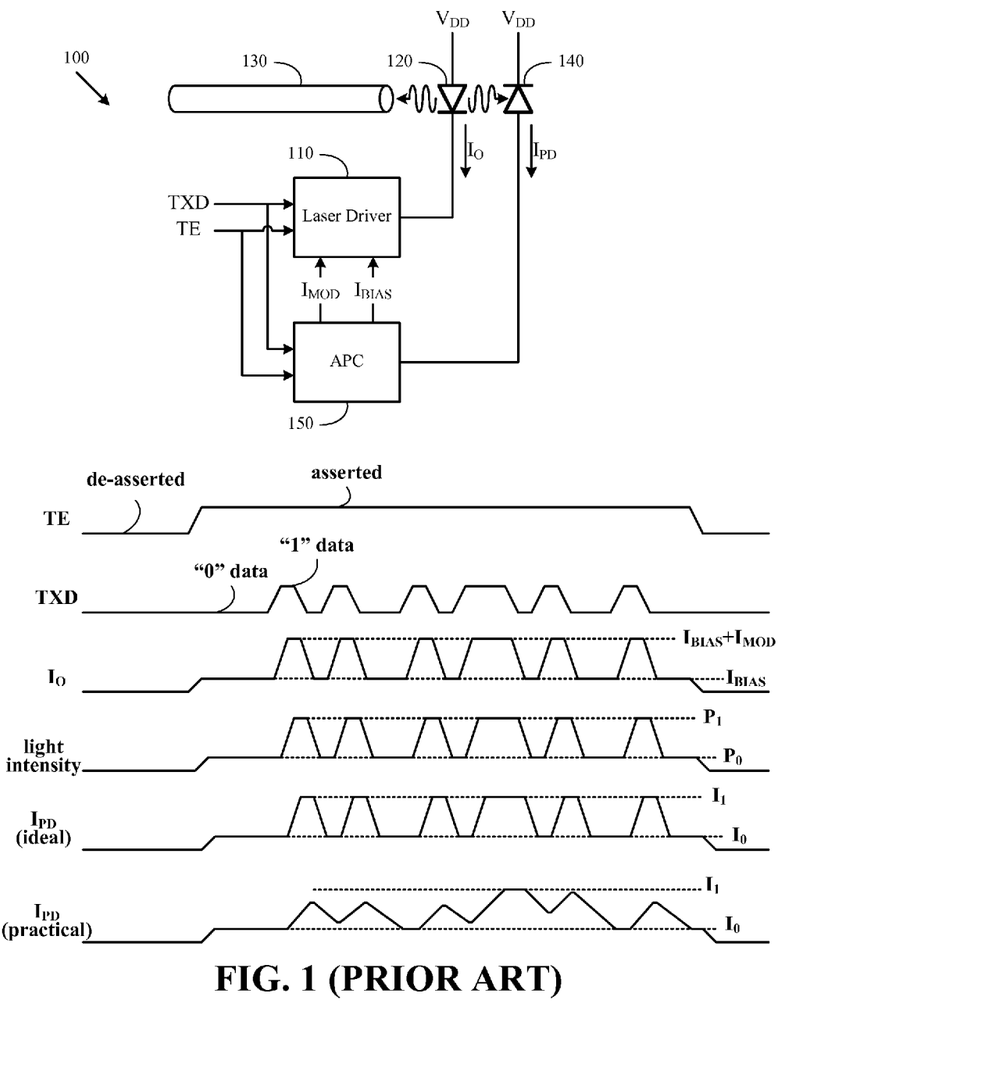
FIG. 1 shows a functional block diagram along with an exemplary timing diagram of a prior art burst mode laser transmitter.

Burst mode laser transmitters are widely used in gigabit passive optical networks (GPONs). A functional block diagram of a prior art burst mode laser transmitter 100 is depicted in FIG. 1. Transmitter 100 comprises: a laser driver 110 for receiving a transmit data TXD, a transmit enable signal TE, a bias current $I_{BIAS}$, and a modulation current $I_{MOD}$, and outputting an output current $I_O$; a laser diode 120 for receiving the output current $I_O$ and emitting a light signal; a optical fiber 130 for receiving the light signal; a photodiode (MPD) 140 for receiving a part of the light signal from a back facet of the laser diode 120 and outputting a photodiode current $I_{PD}$, an automatic power control (APC) block 150 for receiving the photodiode current $I_{PD}$ along with the transmit data TXD and the transmit enable signal TE and outputting the bias current $I_{BIAS}$ and the modulation current $I_{MOD}$.

Throughout this disclosure, $V_{DD}$ denotes a power supply node. An exemplary timing diagram for the transmitter 100 is shown in the lower half of FIG. 1. When the TE signal is de-asserted, the transmitter 100 is disabled and the output current $I_O$ is nil; in this case, the light signal emitted by the laser diode 120 is also nil. When the TE signal is asserted, the transmitter 100 is enabled and the output current $I_O$ will be modulated by the transmit data TXD in accordance with the bias current $I_{BIAS}$ and the modulation current $I_{MOD}$ in the following manner: $I_O$ is equal to $I_{BIAS}$ if TXD is 0, else $I_O$ is equal to $I_{BIAS}+I_{MOD}$; in this case, the light signal emitted by the laser diode 120 will be modulated by the transmitter data TXD such that the light intensity is equal to a first level $P_0$ when TXD is 0 or else the light intensity is equal to a second level $P_1$, wherein $P_0$ and $P_1$ are related to $I_{BIAS}$ and $I_{BIAS}+I_{MOD}$, respectively, via a transfer characteristics of the laser diode 120 that is temperature dependent. When the transmitter 100 is enabled, the light signal being emitted by the laser diode 120 also illuminates the photodiode 140 and causes the photodiode 140 to transmit the photodiode current $I_{PD}$ such that $I_{PD}$ is related to the light intensity via a transfer characteristics of the photodiode 140.

Ideally, the photodiode current $I_{PD}$ is equal to a first current $I_0$ when the light intensity is of the first level $P_0$, and equal to a second current $I_1$ when the light intensity is of the second level $P_1$. APC 150 receives the photodiode current $I_{PD}$. When TXD is 0, APC 150 compares $I_{PD}$ with a first reference current $I_{REF0}$; if $I_{PD}$ is greater than $I_{REF0}$, it indicates $I_{BIAS}$ is too large and needs to be decreased; otherwise $I_{BIAS}$ is too small and needs to be increased. When TXD is 1, APC 150 compares $I_{PD}$ with a second reference current $I_{REF1}$; if $I_{PD}$ is greater than $I_{REF1}$, it indicates $I_{BIAS}+I_{MOD}$ is too large and needs to be decreased, otherwise $I_{BIAS}+I_{MOD}$ is too small and needs to be increased. $I_{BIAS}$ and $I_{MOD}$ are thus adjusted in a closed loop manner so as to make $I_{PD}$ equal to $I_{REF0}$ when TXD is 0 and equal to $I_{REF1}$ when TXD is 1. The two reference currents $I_{REF0}$ and $I_{REF1}$ are determined in accordance with a combination of the characteristics of laser diode 120, the characteristics of photodiode 140, and the temperature, such that when $I_{PD}$ is equal to $I_{REF0}$, ($I_{REF1}$) the light intensity is equal to a first (second) target level. In practice, however, photodiode 140 usually has a very high parasitic capacitance so that $I_{PD}$ does not always track the light intensity accurately. Instead, $I_{PD}$ tracks the light intensity accurately only after a string of successive "0" of "1" bits of TXD. In the particular example shown in FIG. 1, a practical $I_{PD}$ reaches the level $I_0$ ($I_1$) only after two successive "0" ("1") bits of TXD. Also, the high parasitic capacitance of the photodiode 140 makes it challenging to implement a high speed comparison circuit (for comparing $I_{PD}$ with $I_{REF0}$ or $I_{REF1}$).

Accordingly, what is desired is method and apparatus for effective automatic power control for burst mode laser transmitter in the presence of high parasitic capacitance of the photodiode.

SUMMARY

In one embodiment, an apparatus is disclosed, the apparatus comprising: a laser driver for receiving a transmit data, a transmit enable signal, a first control code, and a second control code and outputting an output current; a laser diode for receiving the output current and outputting a light signal; a photodiode for receiving the light signal and outputting a photodiode current; a local oscillator for outputting a local clock signal; a current slicer for receiving the photodiode current, a first reference current, and a second reference current and outputting a first binary decision representing a comparison between the photodiode current and the first reference current, a second binary decision representing a comparison between the photodiode current and the second reference current, a first validation signal for validating the first binary decision, and a second validation signal for validating the second binary decision, wherein the first binary decision, the first validation signal, the second binary decision, and the second validation signal are updated in a timing determined by the transmit enable signal, a photodiode data signal, and the local clock signal; and an automatic power control logic for outputting the first control code and the second control code in response to the first binary decision, the first validation signal, the second binary decision, and the second validation signal.

In one embodiment, the photodiode data signal is derived from the transmit data so that a run of the same bit of a length in the transmit data leads to a run of the same bit of the same length in the photodiode data signal. In one embodiment, the apparatus further comprises a delay buffer for receiving the transmit data and outputting the photodiode data signal. In another embodiment, the apparatus further comprises: a transimpedance amplifier for receiving the photodiode current and outputting a photodiode voltage; a summing circuit for subtracting an average voltage from the photodiode voltage to generate an adjusted photodiode voltage; an equalizer for equalizing the adjusted photodiode voltage to generate an equalized photodiode voltage; and an amplifier for amplifying the equalized photodiode voltage into saturation to generate the photodiode data signal.

In one embodiment, a clock rate of the local clock signal is substantially equal to a data rate of the transmit data. In another embodiment, a ratio between a clock rate of the local clock signal and a data rate of the transmit data is substantially equal to a rational number.

In one embodiment, the current slicer comprises: a current comparator for outputting a first error signal representing a difference between the photodiode signal and the first reference current and a second error signal representing a difference between the photodiode current and the second reference current; an end-of-run detection circuit for generating a first end-of-run signal representing an end to a run of logical 0 bits, a second end-of-run signal representing an end to a run of logical 1 bits, in accordance with the photodiode data signal and the transmit enable signal; a first run detection circuit for using a first counter circuit to generate a first sampling signal to indicate a run of logical 0 bits of a run length in accordance with the first end-of-run signal, the local clock signal, and a run length parameter; a second run detection circuit for using a second counter circuit to generate a second sampling signal to indicate a run of logical 1 bits of the run length in accordance with the second end-of-run signal, the local clock signal, and the run length parameter; a first sign detection circuit for outputting the first binary decision along with the first validation signal by detecting a sign of the first error signal in accordance with a timing determined by the first sampling signal and the local clock signal; and a second sign detection circuit for outputting the second binary decision along with the second validation signal by detecting a sign of the second error signal in accordance with a timing determined by the second sampling signal and the local clock signal. In one embodiment, run detection is validated if a sign of an error signal remains unchanged for a whole clock cycle of the local clock signal after the sign is detected.

In one embodiment, a double sampling based on a timing determined by the first sampling signal and the local clock signal is used to validate a sampling of the first error signal, and a double sampling based on a timing determined by the second sampling signal and the local clock signal is used to validate a sampling of the second error signal.

In one embodiment, a method is disclosed, the method comprising: using a laser driver to generate an output current with a modulation pattern determined by a transmit data and a transmit enable signal, and a modulation level determined by a first control code and a second control code; using a laser diode to generate a light signal in response to the output current; using a photodiode to receive the light signal and generates accordingly a photodiode current; generating a local clock signal using a local oscillator; comparing the photodiode current with a first reference current to generate a first binary decision along with a first validation signal in accordance with a timing determined by a photodiode data signal, the transmit enable signal, and the local clock signal; comparing the photodiode current with a second reference current to generate a second binary decision along with a second validation signal in accordance with a timing determined by the photodiode data signal, the transmit enable signal, and the local clock signal; and updating the first control code and the second control code in response to the first binary decision, the first validation signal, the second binary decision, and the second validation signal in accordance with a timing determined by the local clock signal. In one embodiment, the method further comprises generating the photodiode data signal from the transmit data using a delay buffer.

In another embodiment, the method further comprises: converting the photodiode current into a photodiode voltage using a transimpedance amplifier; subtracting an average voltage from the photodiode voltage to generate an adjusted photodiode voltage using a summing amplifier; equalizing the adjusted photodiode voltage to generate an equalized photodiode voltage; and amplifying the equalized photodiode voltage into saturation to generate the photodiode data signal.

In one embodiment, the method further comprises: generating a first error signal representing a difference between the photodiode current and the first reference current; generating a second error signal representing a difference between the photodiode current and the second reference current; generating a first end-of-run signal by detecting a 0-to-1 transition in the photodiode data signal; generating a second end-of-run signal by detecting a 1-to-0 transition in the photodiode data signal; activating a first sampling signal upon detecting a run of 0's of a certain length using a first counter counting in accordance with the local clock signal when the first end-of-run signal is de-asserted; activating a second sampling signal upon detecting a run of 1's of a certain length using a second counter counting in accordance with the local clock signal when the second end-of-run signal is de-asserted; performing a sign detection of the first error signal using the first sampling signal and the local clock signal to generate the first binary detection along with the first validation signal; and performing a sign detection of the second error signal using the second sampling signal and the local clock signal to generate the second binary detection along with the second validation signal.

In one embodiment, the method further comprises: converting the photodiode current into a photodiode voltage using a first transimpedance amplifier; converting the first reference current into a first reference voltage using a second transimpedance amplifier; converting the second reference current into a second reference voltage using a third transimpedance amplifier; subtracting the first reference voltage from the photodiode voltage to generate a first difference signal; equalizing the first difference signal into the first error signal; subtracting the second reference voltage from the photodiode voltage to generate a second difference signal; and equalizing the second difference signal to generate the second error signal.

DETAILED DESCRIPTION

The following detailed description refers to the accompanying drawings which show, by way of illustration, various embodiments in which the invention may be practiced. These embodiments are described in sufficient detail to enable those skilled in the art to practice these and other embodiments. The various embodiments are not necessarily mutually exclusive, as some embodiments can be combined with one or more other embodiments to form new embodiments. The following detailed description is, therefore, not to be taken in a limiting sense.

Figure 2:
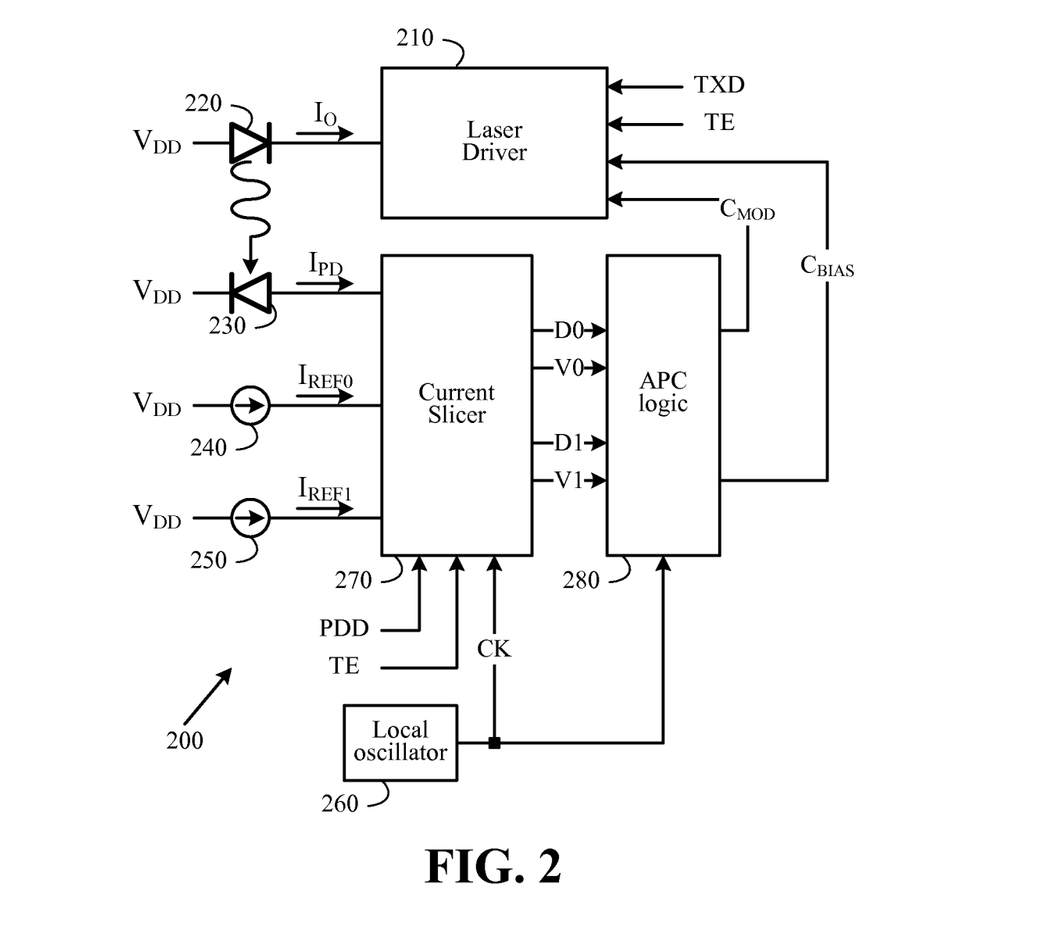
FIG. 2 shows a functional block diagram of a burst mode laser transmitter in accordance with an embodiment of the present invention.

A burst mode laser transmitter 200 in accordance with an embodiment of this present invention is depicted in FIG. 2. Transmitter 200 comprises: a laser driver 210 for outputting an output current $I_O$ in accordance with a transmit data TXD, a transmit enable signal TE, a first control code $C_{BIAS}$, and a second control code $C_{MOD}$; a laser diode 220 for emitting a light signal in accordance with the output current $I_O$; a photodiode 230 for outputting a photodiode current $I_{PD}$ in response to the light signal; a first current source 240 for outputting a first reference current $I_{REF0}$, a second current source 250 for outputting a second reference current $I_{REF1}$, a current slicer 270 for receiving the photodiode current $I_{PD}$, the first reference current $I_{REF0}$, and the second reference current $I_{REF1}$ and outputting a first binary decision D0 along with a first validation signal V0 and a second binary decision D1 along with a second validation signal V1 in accordance with a local clock signal CK, a photodiode data PDD signal, and the transmit enable signal TE; and an automatic power control (APC) logic 280 for outputting the first control code $C_{BIAS}$ and the second control code $C_{MOD}$ in response to the first binary decision D0, the first validation signal V0, the second binary decision D1, the second validation signal V1 in accordance with a timing of the local clock signal CK.

When V0 is high, it indicates a current level detection of the photodiode current $I_{PD}$ for a successive run of "0" of transmit data has been validated; in this case, if D0 is 0 (1), it indicates $I_{PD}$ is lower (higher) than $I_{REF0}$ and it suggests $I_{BIAS}$ needs to be increased (decreased). When V1 is high, it indicates a current level detection of the photodiode current $I_{PD}$ for a successive run of "1" of transmit data has been validated; in this case, if D1 is 0 (1), it indicates $I_{PD}$ is lower (higher) than $I_{REF1}$ and it suggests $I_{BIAS}+I_{MOD}$ needs to be increased (decreased). An intensity of the light signal emitted by the laser diode 220 is thus controlled in a closed loop manner such that when TXD is 1 (0) the photodiode current $I_{PD}$ is approximately equal to $I_{REF1}$ ($I_{REF0}$). In an embodiment, transmitter 200 further comprises a local oscillator 260 for generating the local clock signal CK, which originates from a self oscillation and thus a timing of the local clock signal CK does not track a timing of the transmit data TXD; that is, the local clock signal is asynchronous to the transmit data TXD. In a preferred but not mandatory embodiment, however, a clock rate of the local clock signal CK is approximately equal to a data rate of the transmit data TXD. In a more general embodiment, a ratio between a clock rate of the local clock signal CK to a data rate of the transmit data TXD is approximately a rational number.

Figure 3:
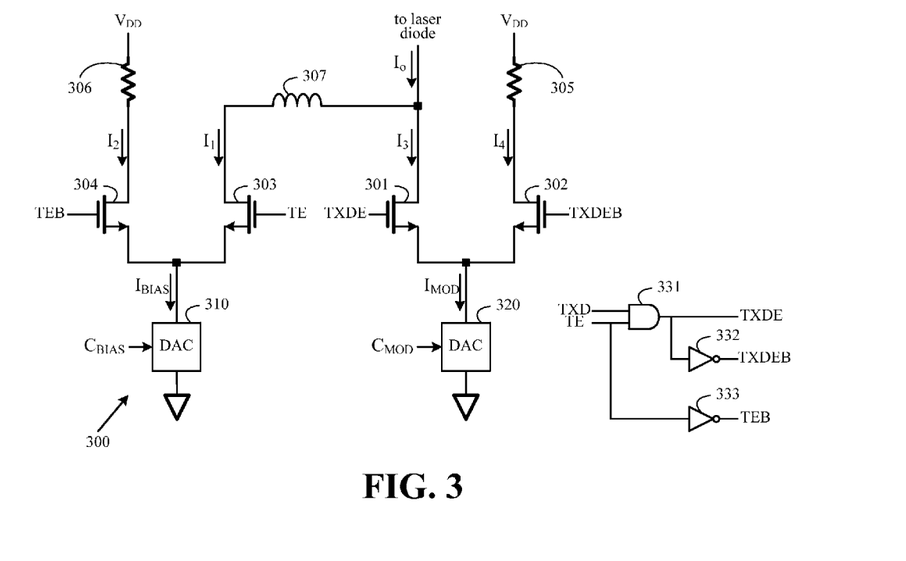
FIG. 3 shows a schematic diagram of a laser driver.

An embodiment 300 suitable for embodying laser driver 210 of FIG. 2 is depicted in FIG. 3. Embodiment 300 comprises: a first current-mode DAC (digital-analog converter) 310 for outputting a bias current $I_{BIAS}$ in accordance with the first control code $C_{BIAS}$; a second current-mode DAC 320 for outputting a modulation current $I_{MOD}$ in accordance with the second control code $C_{MOD}$; a first differential pair comprising two NMOS (N-type metal-oxide semiconductor) 303-304 for receiving the bias current $I_{BIAS}$ and outputting a first current $I_1$ and a second current $I_2$ in accordance with a value of the transmit enable signal TE and its logical inversion TEB (see the inverter 333); and a second differential pair comprising two NMOS transistors 301-302 for receiving the modulation current $I_{MOD}$ and outputting a third current $I_3$ and a fourth current $I_4$ in accordance with a value of a logical signal TXDE and its logical inversion TXDEB (see inverter 332), where TXDE is from a logical AND operation on the transmit data TXD and the transmit enable signal TE (see the AND gate 331). The first current $I_1$ is summed with the third current $I_3$, resulting in the output current $I_O$ that is coupled to the laser diode. In an embodiment, an inductor 307 is inserted in the path of the first current $I_1$ before his summed with $I_3$ to alleviate a high frequency coupling between the first differential pair 303-304 and the second differential pair 301-302. When TE is asserted and TXD is 0, the output current $I_O$ is substantially equal to $I_{BIAS}$, when TE is asserted and TXD is 1, the output current $I_O$ is substantially equal to $I_{BIAS}+I_{MOD}$. When TE is de-asserted, the output current $I_O$ will be substantially zero. The second current $I_2$ is terminated with a first pull-up resistor 306, while the fourth current $I_4$ is terminated with a second pull-up resistor 305. Current-mode DAC 310 (320) can be implemented by using a summing of outputs from a plurality of current sources, each enabled by a respective bit of the control code $C_{BIAS}$ ($C_{MOD}$). The principles and operation of a current-mode DAC are well known to those of ordinary skill in the art and thus need not be described in detail herein.

Figure 4:
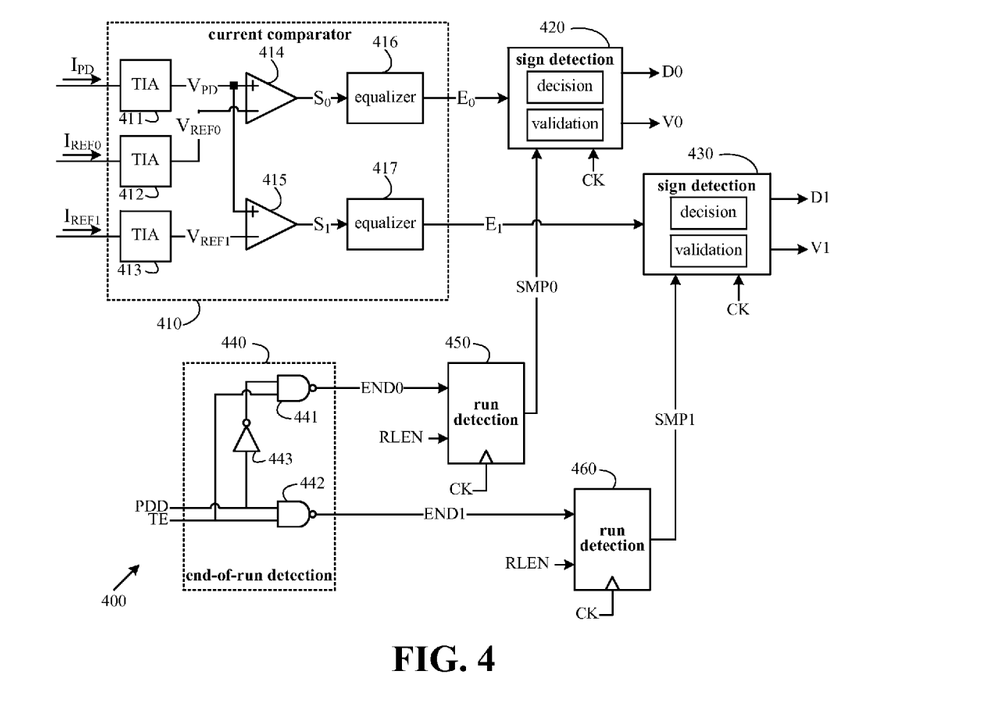
FIG. 4 shows a schematic diagram of a current slicer.

A current slicer 400 suitable for embodying current slicer 270 of FIG. 2 is depicted in FIG. 4. Current slicer 400 comprises: a current comparator 410 for receiving the photodiode current $I_{PD}$, the first reference current $I_{REF0}$, and the second reference current $I_{REF1}$ and outputting a first error signal $E_0$ for representing a difference between $I_{PD}$ and $I_{REF0}$ and a second error signal $E_1$ for representing a difference between $I_{PD}$ and $I_{REF1}$; an end-of-run detection circuit 440 for receiving the photodiode data PDD signal and the transmit enable signal TE and outputting a first end-of-run signal END0 for indicating an end-of-run of "0" bits in the photodiode data PDD signal and a second end-of-run signal END1 for indicating an end-of-run of "1" bits in the photodiode data PDD signal; a first run detection circuit 450 for receiving the first end-of-run signal END0 and a run-length parameter RLEN and outputting a first sampling signal SMP0; a second run detection circuit 460 for receiving the second end-of-run signal END1 and the run-length parameter RLEN and outputting a second sampling signal SMP1; a first sign detection circuit 420 for sampling the first error signal $E_0$ to generate the first binary decision D0 and the first validation signal V0 in accordance a timing provided by the local clock signal CK and the first sampling signal SMP0; and a second sign detection circuit 430 for sampling the second error signal $E_1$ to generate the second binary decision D1 and the second validation signal V1 in accordance a timing provided by the local clock signal CK and the second sampling signal SMP1.

Current comparator 410 compares $I_{PD}$ with $I_{REF0}$ and also compares $I_{PD}$ with $I_{REF1}$ using the following scheme: converting the current-mode signal $I_{PD}$ into a voltage-mode signal $V_{PD}$ using a first transimpedance amplifier (TIA) 411; converting the first reference current $I_{REF0}$ into a first reference voltage $V_{REF0}$ using a second TIA 412; converting the second reference current $I_{REF1}$ into a second reference voltage $V_{REF1}$ using a third TIA 413; subtracting $V_{REF0}$ from $V_{PD}$ to generate a first difference signal $S_0$ using a first amplifier 414; subtracting $V_{REF1}$ from $V_{PD}$ to generate a second difference signal $S_1$ using a second amplifier 415; equalizing the first difference signal $S_0$ to generate the first error signal $E_0$ using a first equalizer 416; and equalizing the second difference signal $S_1$ to generate the second error signal $E_1$ using a second equalizer 417.

Figure 5:
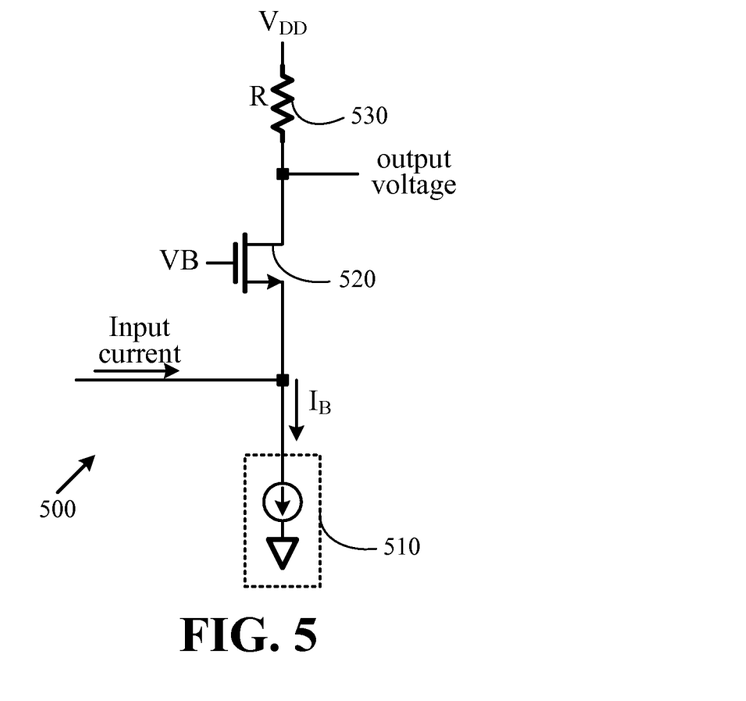
FIG. 5 shows a schematic diagram of a transimpedance amplifier.

FIG. 5 depicts a transimpedance amplifier (TIA) 500 suitable for embodying any one of TIA 411, 412, and 413 of FIG. 4.

TIA 500 receives an input current (e.g., $I_{PD}$, $I_{REF0}$, or $I_{REF1}$) and outputs an output voltage (e.g, $V_{PD}$, $V_{REF0}$, or $V_{REF1}$). TIA 500 comprises a current source 510 for establishing a bias current $I_B$, a NMOS 520 configured as a common-gate amplifier with a gate terminal coupled to a bias voltage VB, and a resistor 530 as a load. TIA 500 is a circuit well known in prior art and self-explanatory to those of ordinary skills in the art, therefore no detailed explanation is given here. By using TIA 500 of FIG. 5 to embody TIA 411 of FIG. 4, for instance, a change of $\Delta I$ in the photodiode current $I_{PD}$ leads to a change of $R \cdot \Delta I$ in the photodiode voltage $V_{PD}$, where R is a resistance of the resistor 530. TIA 500, therefore, has a gain (i.e., transimpedance) of R. Other type of transimpedance amplifier known in the prior art can be employed to embody any one of TIA 411, 412, and 413 of FIG. 4. Note that TIA 411, 412, and 413 do not necessarily need to be embodied by the same circuit; they can be embodied by different circuits, as long as their respective gains are properly set so that the respective values of $V_{PD}$, $V_{REF1}$, and $V_{REF0}$ remain the same as if TIA 411, 412, and 413 are all constructed from the same circuit. In contrast with the photodiode current $I_{PD}$ that is time-varying, the first reference current $I_{REF0}$ and the second reference current $I_{REF1}$ are substantially time-invariant for an operation duration of interest.

To save power consumption, one may intentionally scale down the first (second) reference current $I_{REF0}$ ($I_{REF1}$) by a factor but also scale up the gain of TIA 412 (413) by the same factor, resulting in the same reference voltage $V_{REF0}$ ($V_{REF1}$). For instance, a gain of a transimpedance amplifier constructed from the circuit topology of FIG. 5 can be scaled up by a factor of two by halving the bias current $I_B$, halving a width of NMOS 520, but doubling the resistance of resistor 530. Doubling the gain reduces a speed of the transimpedance amplifier, but it is probably acceptable for TIA 412 and 413 since their respective inputs are substantially time-invariant.

Figure 6:
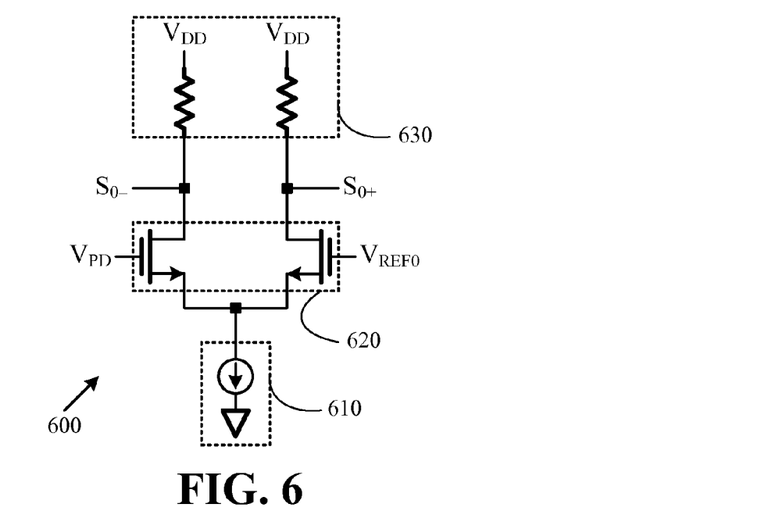
FIG. 6 shows s schematic diagram of a differential amplifier.

FIG. 6 depicts a differential amplifier 600 suitable for embodying amplifier 414 of FIG. 4. Differential amplifier 600 comprising a current source 610, a NMOS differential pair 620, and a resistor pair 630. Differential amplifier 600 is well known in prior art and self-explanatory to those of ordinary skills in the art, therefore no detailed explanation is given here. In this particular embodiment 600, the first difference signal $S_0$ is embodied as a differential signal comprising a first end $S_{0+}$ and a second end $S_{0-}$. The same circuit topology of FIG. 6 can be employed to embody second amplifier 415 of FIG. 4; one just needs to replace $V_{REF0}$ with $V_{REF1}$ and replace $S_0$ with $S_1$.

An equalizer is a circuit for receiving an input signal and outputting an output signal in a manner so as to mend a distortion in the input signal. With respect to equalizers 416 and 417 of FIG. 4, the distortion to be corrected originates from a heavy loss of high-frequency components in the photodiode voltage signal $V_{PD}$ due to a heavy capacitive load at the photodiode. To correct this distortion, a boost of high-frequency components is needed.

Figure 7:
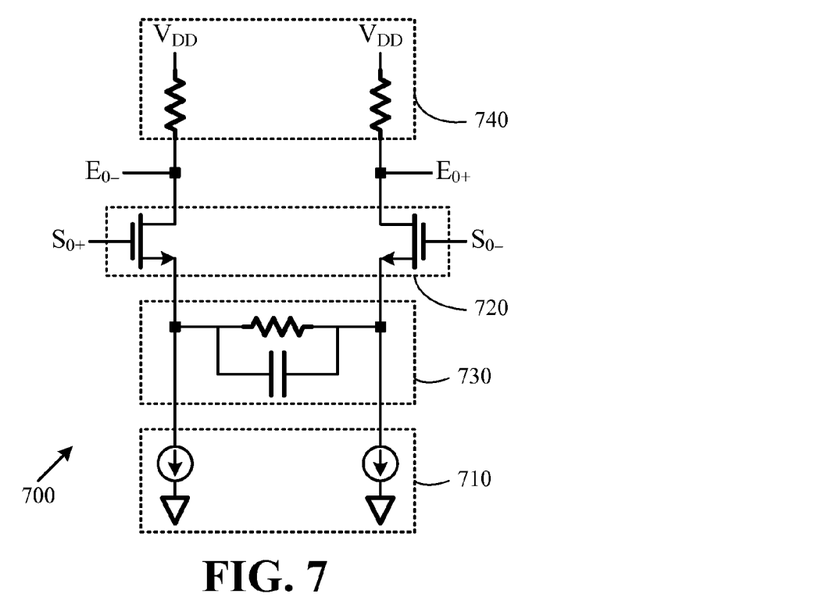
FIG. 7 shows a schematic diagram of an equalizer.

FIG. 7 depicts an equalizer 700 suitable for embodying equalizer 416 of FIG. 4. Equalizer 700 comprises: a pair of current sources 710, a NMOS differential pair 720, a pair of resistors 740, and a source degeneration circuit 730 comprising a parallel resistor-capacitor circuit. The source degeneration circuit 730 causes less degeneration to a higher frequency component, thus relatively boosting the higher frequency component. The structure and operation of equalizer 700 is well known in the prior art and understood by those of ordinary skill in the art. Therefore no detailed explanation is provided herein with respect to the equalizer 700. The same embodiment 700 can be effectively employed to embody equalizer 417 of FIG. 4; one just needs to replace $S_0$ with $S_1$ and replace $E_0$ with $E_1$.

Now refer back to FIG. 2. Photodiode data PDD signal is a binary signal that approximately represents a waveform of the photodiode current $I_{PD}$. Note that the photodiode current $I_{PD}$ is generated in response to the light signal emitted by the laser diode 220, the light signal is excited in response to the output current $I_O$ to the laser diode 220, and the output current $I_O$ is modulated in response to the transmit data TXD. Therefore, the photodiode current $I_{PD}$ is modulated in accordance with the transmit data TXD. In one embodiment, the transmit data TXD is directly used as the photodiode data PDD signal, because transmit data TXD is a good representation of the waveform of the photodiode current $I_{PD}$ due to that the photodiode current $I_{PD}$ is modulated in accordance with the transmit data TXD. In an alternative embodiment, a delay of the transmit data TXD is used as the photodiode data PDD signal, wherein the delay is embodied by a buffer circuit. The delay is used to mimic a circuit delay from a change in the transmit data TXD to a corresponding change to the photodiode current $I_{PD}$.

In yet another embodiment, the photodiode data PDD signal is obtained using the following steps: subtracting an average voltage $V_{AV}$ from the photodiode voltage $V_{PD}$ of FIG. 4 to generate an adjusted voltage signal; equalizing the adjusted voltage signal to boost a high-frequency component therein to generate an equalized voltage signal; and amplifying the equalized voltage signal into saturation to generate the photodiode data PDD signal. Here, the average voltage $V_{AV}$ is estimate of an average of the photodiode voltage $V_{PD}$; in one embodiment, the average voltage $V_{AV}$ is a voltage level in the midway between the first reference voltage $V_{REF0}$ and the second reference voltage $V_{REF1}$. In any one of the three abovementioned embodiments for generating the photodiode data PDD signal, a successive run of binary 0 (or 1) in the photodiode current $I_{PD}$ corresponds to a successive run of binary 0 (or 1) of the same length in the photodiode data signal, therefore photodiode data PDD signal is useful to indicate a good timing for detecting a level of the photodiode current $I_{PD}$ whenever a run of successive "1" or "0" is spotted. As mentioned earlier, after a successive run of binary 0 (1), the photodiode current $I_{PD}$ and corresponding voltage will settle and suitable for level detection despite a heavy capacitive load at the photodiode.

Now reference is again made to FIG. 4. End-of-run detection 440 comprises a first NAND gate 441, a second NAND gate 442, and an inverter 443 in a configuration so that the first end-of-run signal END0 is asserted whenever the transmit enable signal TE is de-asserted or the photodiode data PDD signal is 1, and the second end-of-run signal END1 is asserted whenever the transmit enable signal TE is de-asserted or the photodiode data PDD signal is 0. When the transmit enable signal TE is de-asserted, the transmitter is not enabled and thus there should be no run of either "1" or "0" whatsoever. When the transmit enable signal TE is asserted, an end-of-run of "1" is detected when the photodiode data PDD signal transitions from 1 to 0, and an end-of-run of "0" is detected when the photodiode data PDD signal transitions from 0 to 1.

Figure 8:
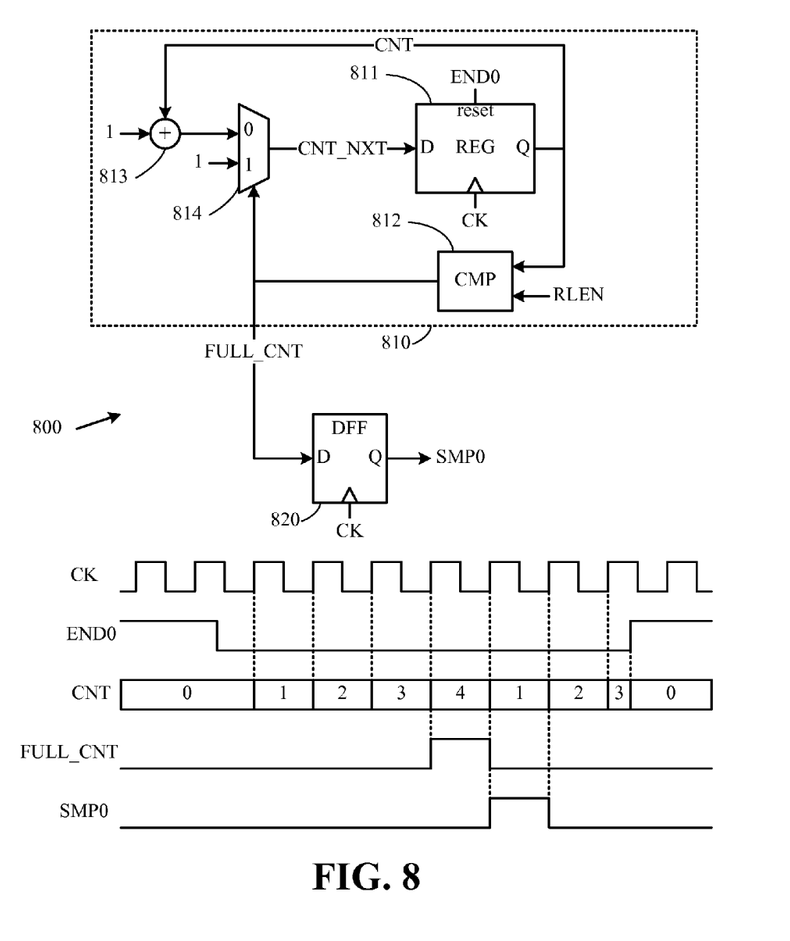
FIG. 8 shows a schematic diagram along with an exemplary timing diagram of a run detection circuit.

The first run detection circuit 450 of FIG. 4 is used to detect a successive run of "0" bits in the photodiode data PDD signal. An embodiment 800 suitable for embodying the first run detection circuit 450 of FIG. 4, along with an exemplary timing diagram for a case where the run length parameter RLEN equals 4, is depicted in FIG. 8. Embodiment 800 includes a counter circuit 810 comprising: a register 811, a digital comparator 812, an adder 813, and a multiplexer 814. A counting value CNT is stored by register 811. When the first end-of-run signal END0 is asserted, register 811 is reset, and the counting value CNT is reset to zero. When the first end-of-run signal END0 is de-asserted, upon a rising edge of the local clock signal CK, the counting value CNT is updated to a next counting value CNT_NXT, which is an output of the multiplexer 814. The digital comparator 812 compares the counting value CNT with the run length parameter RLEN and outputs a logical signal FULL_CNT indicating a full count condition; FULL_CNT is asserted if the counting value CNT equals the run length parameter RLEN, and de-asserted otherwise. The logical signal FULL_CNT is used to control the multiplexer 814. When FULL_CNT is asserted, multiplexer

814 selects 1 as the value for CNT_NXT; otherwise, multiplexer 814 selects CNT+1 (from the adder 813) as the value for CNT_NXT. In this manner, the counter 810 cyclically counts from 1 to RLEN until the first end-of-run signal END0 is asserted. Embodiment 800 further comprises a data flip flop (DFF) 820 for sampling the full count signal FULL_CNT at a rising edge of the local clock signal CK to output the first sampling signal SMP0. As shown in the timing diagram, a one-cycle pulse in the first sampling signal SMP0 is formed when the counter 810 successfully counts to RLEN (which equals 4 in this particular example).

Embodiment 800 is also suitable for embodying the second run detection circuit 460 of FIG. 4; one just needs to replace the first end-of-run signal END0 with the second end-of-run signal END1, and replace the first sampling signal SMP0 with the second sampling signal SMP1. Note that, however, one does not necessarily need to use the same value of run length parameter RLEN for the second run detection circuit 460 as that used for the first run detection circuit 450.

Refer is again made to FIG. 4. First sign detection circuit 420 is employed to fulfill two functions: detection and validation. The detection function is to detect a polarity of the first error signal $E_0$, resulting in the first binary decision D0; while the validation function is to indicate whether the detection is valid, resulting in the first validation signal V0. D0 is 1 (0) indicates the first error signal $E_0$ is positive (negative); V0 is 1 (0) indicates the decision is valid (invalid). The detection function can be embodied by a sampling latch 900 depicted in FIG. 9. Sampling latch 900 comprises a dynamic comparator 910 and a SR latch 920. Dynamic comparator 910 comprises three NMOS (short for n-type metal-oxide semiconductor field effect transistors) 911-913 and four PMOS (short for p-type metal-oxide semiconductor field effect transistors) 914-917 for receiving the first error signal $E_0$ and outputting two logical signals R and S. When the first sampling signal SMP0 is logically 0, both R and S are preset to 1 (or $V_{DD}$, logical high). When the first sampling signal SMP0 is logically 1, the polarity of the first error signal $E_0$ is detected and represented by R and S: if $E_0$ is positive (i.e., $E_{0+}$ is higher than $E_{0-}$), then S is 1 and R is 0; otherwise, S is 0 and R is 1.

Figure 9:
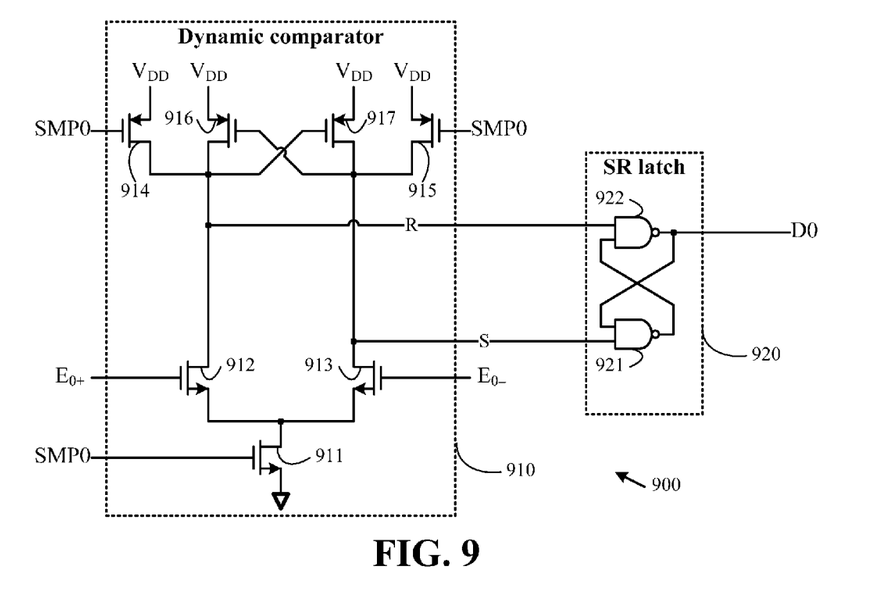
FIG. 9 shows a schematic diagram of a sampling latch.

The structure and operation of dynamic comparator 910 is well known in the art and will be understood to those of ordinary skill in the art, therefore no detailed explanation is given here. SR latch 920 comprises two NAND gates 921-922 for receiving R and S and outputting the first binary decision D0. Similarly, the SR latch is well known in prior art and thus need not be explained in detail here.

Figure 10:
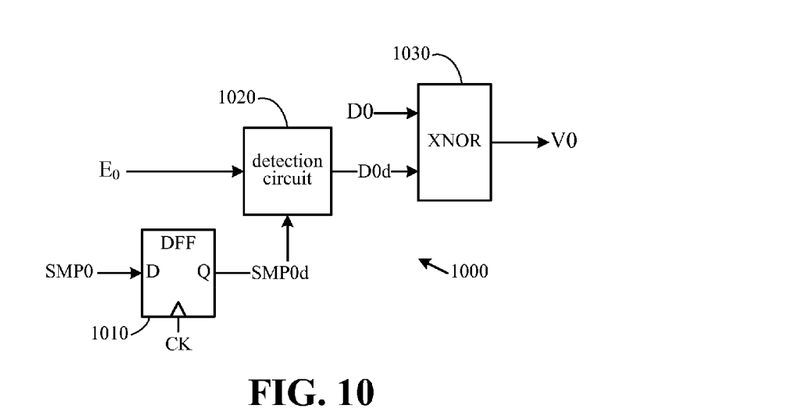
FIG. 10 shows a schematic diagram of a validation circuit.

An embodiment 1000 suitable for embodying the validation function is depicted in FIG. 10. Embodiment 1000 comprises: a data flip-flop (DFF) 1010 for sampling the first sampling clock SMP0 in accordance with the local clock signal CK to generate SMP0$d$, which is a unit cycle delay of the first sampling clock SMP; a detection circuit 1020 for detecting the first error signal $E_0$ in accordance with a timing provided by SMP0$d$ to generate a delayed binary decision D0$d$; and a XNOR gate 1030 for performing an exclusive NOR operation on D0 and D0$d$ to output the first validation signal V0. Detection circuit 1020 can be embodied using the same circuit as the sampling latch 900 of FIG. 9; one merely needs to replace SMP0 with SMP0$d$ and replace D0 with D0$d$. If a value of D0$d$ is the same as that of D0, it indicates the two detections are consistent and suggests the first error signal $E_0$ is steady for at least one clock cycle of the local clock signal CK after a rising edge of the first sampling clock signal SMP0; in this case, the detection is deemed reliable and valid and the first validation signal V0 is thus asserted. Otherwise, it indicates the two detections are inconsistent and therefore deemed unreliable and invalid.

Referring again to FIG. 4. The second sign detection circuit 430 is identical to the first sign detection circuit 420, except that it detects the second error signal $E_1$ and outputs the second binary decision D1 and the second validation signal V1, instead of detecting the first error signal $E_0$ and outputting the first binary decision D0 and the first validation signal V1.

Referring again to FIG. 2. APC logic 280 adjusts $C_{BIAS}$ and $C_{MOD}$ (and effectively adjusts $I_{BIAS}$ and $I_{MOD}$, respectively) in accordance with D0, V0, D1, and V1 in a timing controlled by the local clock signal CK. In one embodiment, the local clock signal CK is divided down by a factor of RLEN, resulting in a divided-down clock CK', and the APC logic 280 updates $C_{BIAS}$ and $C_{MOD}$ at a rising edge of the divided-down clock CK'; In a first embodiment, $C_{BIAS}$ and $C_{MOD}$ are updated in accordance with an algorithm described in C-language as follows:

```
if (V0==1) {
    if (D0==0)
        C_BIAS=C_BIAS+delta;
    else
        C_BIAS=C_BIAS-delta;
}
if (V1==1) {
    if (D1==0)
        C_MOD=C_MOD+delta;
    else
        C_MOD=C_MOD-delta;
}
```

Here, delta is an adaptation constant. In an alternative embodiment, $C_{BIAS}$ and $C_{MOD}$ are updated in accordance with an algorithm described in C-language as follows:

```
if (V0==1) {
    if (D0==0)
        C_BIAS=C_BIAS+delta; C_MOD=C_MOD-delta;
    else
        C_BIAS=C_BIAS-delta;  C_MOD=C_MOD+delta;
}
if (V1==1) {
    if (D1==0)
        C_MOD=C_MOD+delta;
    else
        C_MOD=C_MOD-delta;
}
```

In a yet alternative embodiment, $C_{BIAS}$ and $C_{MOD}$ are updated in accordance with an algorithm described in C-language as follows:

```
if (V0==1) {
    if (D0==0)
        C_BIAS=C_BIAS+delta;
    else
        C_BIAS=C_BIAS-delta;
}
if (V1==1) {
    if (D1==0)
        C_MOD=C_MOD+delta/2; C_BIAS=C_BIAS+delta/2;
    else
        C_MOD=C_MOD-delta/2;  C_BIAS=C_BIAS-delta/2;
}
```

In one embodiment, the first control code is increased under at least one of the following two conditions: (1) the first validation signal is 1 and the first binary decision is 0, and (2) the second validation signal is 1 and the second binary decision is 0; the first control code is decreased under at least one of the following two conditions: (1) the first validation signal is 1 and the first binary decision is 1, and (2) the second validation signal is 1 and the second binary decision is 1; the second control code is increased under at least one of the following two conditions: (1) the first validation signal is 1 and the first binary decision is 1, and (2) the second validation signal is 1 and the second binary decision is 0; and the second control code is decreased under at least one of the following two conditions: (1) the first validation signal is 1 and the first binary decision is 0, and (2) the second validation signal is 1 and the second binary decision is 1.

Numerous variations to aforementioned embodiments for adjusting $C_{BIAS}$ and $C_{MOD}$ can be implemented consistent with the scope and spirit of the present invention. For instance: in one variation, different values of delta (i.e. the amount of incremental change) are used for updating $C_{BIAS}$ and $C_{MOD}$; in another variation, $C_{BIAS}$ (or $C_{MOD}$) is updated only after the same update condition repeatedly occurs.

Local oscillator 260 of FIG. 2 can be embodied using any self-oscillating oscillator known in prior art, e.g.: ring oscillator, relaxation oscillator, LC oscillator, and so on. However, to make the automatic power control work more effectively, an oscillator of an accurate oscillating frequency or a calibration of an oscillation frequency is preferred.

Although specific embodiments have been illustrated and described herein, it will be appreciated by those of ordinary skill in the art that any arrangement that is calculated to achieve the same purpose may be substituted for the specific embodiments shown. This application is intended to cover adaptations and variations of the embodiments discussed herein. Various embodiments use permutations and/or combinations of embodiments described herein. It is to be understood that the above description is intended to be illustrative, and not restrictive, and that the phraseology or terminology employed herein is for the purpose of description.

What is claimed is:

1. An apparatus comprising:
   a laser driver for receiving a transmit data, a first control code, and a second control code and outputting an output current;
   a current slicer for receiving a photodiode current, a first reference current, and a second reference current, the current slicer outputting a first decision based on a comparison between the photodiode current and the first reference current, the current slicer further outputting a second decision based on a comparison between the photodiode current and the second reference current; and
   a power control logic for outputting the first control code and the second control code in response to the first decision, and the second decision.

2. The apparatus of claim 1, wherein the current slicer further output a first validation signal for validating the first decision, and a second validation signal for validating the second decision; wherein the first control code and the second control code are generated in response to the first decision, the first validation signal, the second decision, and the second validation signal.

3. The apparatus of claim 2, wherein the first decision, the first validation signal, the second decision, and the second validation signal are updated in a timing determined by a transmit enable signal, a photodiode data signal, and a local clock signal.

4. The apparatus of claim 1, further comprising:
   a local oscillator for outputting a local clock signal;
   wherein the first decision, and the second decision are updated in a timing determined by a transmit enable signal, a photodiode data signal, and the local clock signal.

5. The apparatus of claim 1, wherein the current slicer comprises:
   a current comparator for generating a first error signal representing a difference between the photodiode current and the first reference current, and a second error signal representing a difference between the photodiode current and the second reference current;
   a first run detection circuit including a first counter for outputting a first sampling signal in accordance with a first end-of-run signal, and a first run length parameter;
   a second run detection circuit including a second counter for outputting a second sampling signal in accordance with a second end-of-run signal and a second run length parameter, wherein the first end-of-run signal and the second end-of-run signal are generated in accordance with a photodiode data signal and a transmit enable signal;
   a first sign detection circuit for outputting the first decision in accordance with a sampling of the first error signal using a timing determined by the first sampling signal; and
   a second sign detection circuit for outputting the second decision in accordance with a sampling of the second error signal using a timing determined by the second sampling signal.

6. The apparatus of claim 5, wherein the current comparator comprises a plurality of transimpedance amplifiers.

7. The apparatus of claim 5, wherein the first sign detection circuit is based on a double sampling in accordance with a timing determined by the first sampling signal, and the second sign detection circuit is based on a double sampling in accordance with a timing determined by the second sampling signal.

8. The apparatus of claim 4 further comprises a buffer circuit for receiving the transmit data and outputting the photodiode data signal.

9. The apparatus of claim 4, wherein a clock rate of the local clock signal is approximately equal to a data rate of the transmit data.

10. The apparatus of claim 4, wherein the local clock signal is asynchronous to the transmit data.

11. A method for controlling power of a transmitter, the method comprising:
    generating an output current with a modulation pattern determined by a transmit data and a transmit enable signal, and a modulation level determined by a first control code and a second control code, wherein a light signal is generated in response to the output current;
    generating a first decision based on a comparison between a photodiode current and a first reference current;
    generating a second decision based on a comparison between the photodiode current and a second reference current, wherein the photodiode current is generated in accordance to the light signal; and
    generating the first control code and the second control code in response to the first decision and the second decision.

12. The method of claim 11, further comprising:
    generating a first validation signal for validating the second decision, and a second validation signal for validating the second decision;

wherein the first control code and the second control code are generated in response to the first decision, the first validation signal, the second decision, and the second validation signal.

13. The method of claim 11, wherein the first decision, and the second decision are updated in a timing determined by the transmit enable signal, a photodiode data signal, and a local clock signal.

14. The method of claim 13, wherein a clock rate of the local clock signal is approximately equal to a data rate of the transmit data.

15. The method of claim 13, wherein the local clock signal is asynchronous to the transmit data.

16. The method of claim 13 further comprises:
generating the photodiode data signal according to the transmit data.

17. The method of claim 11 further comprising:
generating a first error signal representing a difference between the photodiode current and the first reference current;
generating a second error signal representing a difference between the photodiode current and the second reference current;
generating a first sampling signal using a first run detection circuit including a first counter operating in accordance with a first end-of-run signal and a first run length parameter;
generating a second sampling signal using a second run detection circuit including a second counter operating in accordance with a second end-of-run signal and a second run length parameter;
generating the first decision in accordance with a sampling of the first error signal using a timing determined by the first sampling signal; and
generating the second decision in accordance with a sampling of the second error signal using a timing determined by the second sampling signal.

* * * * *